(12) United States Patent
Maier

(10) Patent No.: US 8,310,301 B2
(45) Date of Patent: Nov. 13, 2012

(54) FULLY FEATURED CONTROL PIN POWERED ANALOG SWITCH

(75) Inventor: Erik Maier, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/713,039

(22) Filed: Feb. 25, 2010

(65) Prior Publication Data

US 2011/0204960 A1 Aug. 25, 2011

(51) Int. Cl.
*H01L 25/00* (2006.01)

(52) U.S. Cl. ........... 327/564; 327/565; 327/566; 326/37

(58) Field of Classification Search .......... 327/564–566; 326/37
See application file for complete search history.

(56) References Cited

U.S. PATENT DOCUMENTS

| | | | |
|---|---|---|---|
| 4,970,692 A * | 11/1990 | Ali et al. | 365/230.06 |
| 4,982,113 A * | 1/1991 | Jinbo | 326/80 |
| 6,005,423 A | 12/1999 | Schultz | |
| 6,060,914 A * | 5/2000 | Nunokawa | 327/91 |
| 6,320,446 B1 * | 11/2001 | Podlesny et al. | 327/333 |
| 6,388,469 B1 * | 5/2002 | Hunt et al. | 326/81 |
| 6,404,237 B1 * | 6/2002 | Mathew et al. | 326/113 |
| 6,894,266 B2 * | 5/2005 | Richard et al. | 250/214 R |
| 7,002,400 B2 * | 2/2006 | Koo | 327/536 |
| 7,005,911 B1 * | 2/2006 | Om'mani | 327/408 |
| 7,098,633 B1 * | 8/2006 | Brokaw et al. | 323/222 |
| 7,135,898 B2 | 11/2006 | Tseng et al. | |
| 7,378,896 B2 * | 5/2008 | Wong et al. | 327/333 |
| 7,626,446 B2 * | 12/2009 | Yeh | 327/536 |
| 7,839,102 B1 * | 11/2010 | Rana et al. | 318/254.1 |
| 2011/0204955 A1 | 8/2011 | Maier | |

FOREIGN PATENT DOCUMENTS

| | | |
|---|---|---|
| CN | 102170283 A | 8/2011 |
| CN | 102195627 A | 9/2011 |
| KR | 1020110016453 A | 8/2011 |
| KR | 1020110097711 A | 8/2011 |

OTHER PUBLICATIONS

"U.S. Appl. No. 12/713,032 , Response filed Jul. 29, 2011 to Non Final Office Action mailed May 2, 2011", 15 pgs.
"U.S. Appl. No. 12/713,032, Advisory Action mailed Dec. 5, 2011", 3 pgs.
"U.S. Appl. No. 12/713,032, Decision on Pre-Appeal Brief Mailed Feb. 2, 2012", 12 pgs.

(Continued)

*Primary Examiner* — Kenneth B. Wells
(74) *Attorney, Agent, or Firm* — Schwegman, Lundberg & Woessner, P.A.

(57) ABSTRACT

An apparatus comprises at least one input connection, at least one output connection, at least one control connection, a voltage converter circuit having an input coupled to the control connection and an output, wherein the voltage converter circuit is configured to provide a voltage at its output that is greater than a voltage present at its input, and at least one switch circuit coupled to the input connection, the output connection, and the output of the voltage converter circuit. The switch circuit passes a signal received at the input to the output when the switch circuit is activated by the voltage converter output. Power to the voltage converter circuit is provided via the control connection, and power to the switch circuit is provided via the output of the voltage converter circuit.

20 Claims, 5 Drawing Sheets

OTHER PUBLICATIONS

"U.S. Appl. No. 12/713,032, Examiner Interview Summary mailed Nov. 22, 2011", 3 pgs.

"U.S. Appl. No. 12/713,032, Final Office Action mailed Sep. 23, 2011", 12 pgs.

"U.S. Appl. No. 12/713,032, Non Final Office Action mailed Feb. 24, 2012", 12 pgs.

"U.S. Appl. No. 12/713,032, Non Final Office Action mailed May 2, 2011", 12 pgs.

"U.S. Appl. No. 12/713,032, Pre-Appeal Brief Request filed Dec. 22, 2011", 5 pgs.

"U.S. Appl. No. 12/713,032, Response filed Nov. 23, 2011 to Final Office Action mailed Sep. 23, 2011", 10 pgs.

* cited by examiner

FULLY FEATURED CONTROL PIN POWERED ANALOG SWITCH

BACKGROUND

An analog switch is often used in electronic circuit designs. An analog switch is used to transmit an analog signal to a circuit path or to prevent an analog signal from being sent to a circuit path. As more and more functionality is expected from electronic devices, there are many advantages to reducing the size of an analog switch.

OVERVIEW

This document relates generally to electronic switches and methods of their implementation. In example 1, an integrated circuit includes at least one input connection, at least one output connection, at least one control connection, a voltage converter circuit having an input coupled to the control connection and an output, and at least one switch circuit coupled to the input connection, the output connection, and the output of the voltage converter circuit. The voltage converter circuit is configured to provide a voltage at its output that is greater than a voltage present at its input. The switch circuit passes a signal received at the input to the output when the switch circuit is activated by the voltage converter output. Power to the voltage converter circuit is provided via the control connection, and power to the switch circuit is provided via the output of the voltage converter circuit.

In example 2, the integrated circuit of example 1 does not include a separate dedicated power connection to provide power to one or both of the switch circuit and the voltage converter circuit.

In example 3, the voltage converter circuit of any one of examples 1 and 2 optionally includes a charge pump circuit.

In example 4, the integrated circuit of any one of example 3 optionally includes a clock generator circuit coupled to the control connection and the charge pump circuit. The charge pump circuit is configured to receive a clock signal from the clock generator circuit. Power to the clock generator circuit is provided by the control connection.

In example 5, the charge pump circuit of any one of examples 3 and 4 optionally provides a voltage to the switch circuit that is about twice a voltage received at the control connection.

In example 6, the switch circuit of any one examples 1-5 optionally includes a pass gate. The pass gate is activated when a control signal is received at the control connection and provided to the pass gate by the voltage converter circuit. Power to the pass gate is provided via the output of the voltage converter circuit.

In example 7, an input signal to the integrated circuit is optionally available at the output connection when the pass gate is activated. A signal at the output connection has a greater voltage than a voltage of the control connection.

In example 8, the integrated circuit of any one of claims 1-7 optionally includes a buffer circuit connected between the control connection and the pass gate. Power to the buffer circuit is provided via the output of the voltage converter circuit.

In example 9, the buffer circuit of example 8 optionally provides a first voltage level to activate the voltage converter circuit and a second voltage level to deactivate the voltage converter circuit. The first voltage level is greater than the second voltage level.

In example 10, the integrated circuit of any one of examples 6-9 optionally includes a buffer circuit connected between the input connection and the pass gate. The buffer circuit is configured to delay a signal received at the input connection relative to the control signal received at the control connection, and the delay is longer than a time for the voltage converter circuit to produce the voltage at its output that is greater than the voltage at its input.

In example 11, the integrated circuit of any one of claims 1-10 optionally includes a four-connector electronic package. The four connectors consist of a input connection, an output connection, a control connection, and a circuit ground connection.

In example 12, the integrated circuit of any one of claims 1-11 optionally includes a plurality of input connection and output connection pairs and a switch circuit connected between an input connection and output connection pair. Each switch circuit passes a signal received at its input connection to its output connection when a control signal is received at the control connection and provided to the switch circuit by the voltage converter circuit. Power to the switch circuits is provided via the output of the voltage converter circuit.

In example 13, the switch circuit of any one of claims 1-12 is optionally configured as a single pole single throw (SPST) switch.

In example 14, the integrated circuit of any one of claims 1-11 and 13 optionally includes a plurality of input connection and output connection pairs, a switch circuit connected between an input connection and output connection pair, a control connection for each switch circuit, and a voltage converter circuit for each switch circuit coupled between the control connection and the switch circuit. Each switch circuit passes a signal received at its input connection to its output connection when a control signal is received at the control connection and provided to the switch circuit by its corresponding voltage converter circuit. Power to each switch circuit is provided via the output of its corresponding voltage converter circuit.

In example 15, a method includes supplying power to a voltage converter circuit via a control connection and supplying power to a switch circuit via an output of the voltage converter circuit. The voltage converter circuit is configured to provide an output voltage that is greater than an input voltage to the voltage converter circuit, and the switch circuit is configured to pass a signal received at an input of the switch circuit to an output of the switch circuit when the switch circuit is activated by the output of the voltage converter circuit.

In example 16, the method of example 15 includes supplying power to the voltage converter circuit and the switch circuit without a separate dedicated power connection.

In example 17, the supplying power to a voltage converter circuit via a control connection of any one of examples 15 and 16 optionally includes supplying power to a charge pump circuit. Power to the charge pump circuit is provided by the control connection and power to the switch circuit is provided by the charge pump circuit.

In example 18, the method of any one of examples 15-17 optionally includes packaging the voltage converter circuit and the switch circuit in a four connector package.

In example 19, the packaging the voltage converter circuit and the switch circuit of example 18 optionally includes packaging the voltage converter circuit and the switch circuit in a package having four connectors consisting of an input connection, an output connection, a control connection, and a circuit ground connection.

In example 20, the method of any one of examples 15-17 optionally includes providing hysteresis at the control connection to provide an activating trip voltage level for the voltage converter circuit that is greater than a deactivating trip voltage level for the voltage converter circuit.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
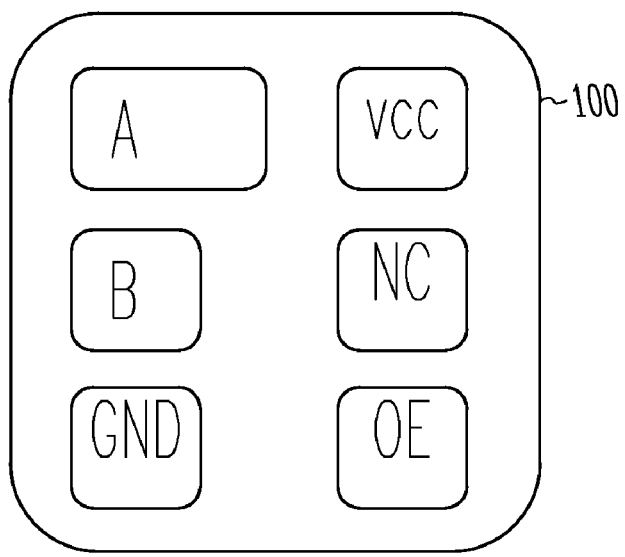
FIG. 1 is an illustration of a typical analog switch package.

This document relates generally to electronic switches. FIG. 1 is an illustration of a typical analog switch package 100. The packaged analog switch includes five connections. These connections can be pins or leads of the package for example. The connections labeled A and B designate the input and output of the analog switch. The connection labeled OE designates the output enable or control input of the analog switch. An analog switch typically requires a dedicated supply connection labeled in FIG. 1 as the VCC connection and a circuit ground connection labeled GND in the Figure.

These five connections result in a six pin package for the typical analog switch (e.g., the NC label indicates no connect). The analog switch package 100 is configured as either 2×3 connections or 3×2 connections. The dimensions for a circuit packaged as a six-lead MicroPak, can be 1.0 mm×1.45 mm.

Figure 2:
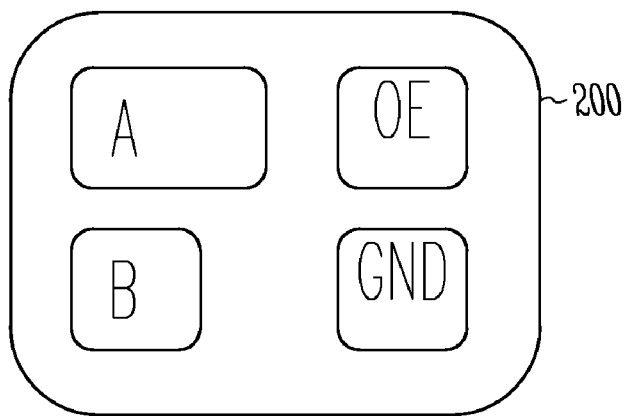
FIG. 2 is an illustration of an example of analog switch package that includes four connections.

FIG. 2 is an illustration of an example of analog switch package 200 that includes four connections: the A, B, OE, and GND connections. The dimensions for an integrated circuit packaged as a four-lead MicroPak, can be 1.0 mm×1.0 mm. This results in smaller footprint and reduced cost.

To provide the same functionality, the switch circuit packaged as in FIG. 2 is powered from the control connection instead of a separate power connection. When the switch circuit is activated by a control signal received at the control connection, power to the switch circuit is provided and the switch circuit passes a signal received at the input to the output. Note that in this case a separate dedicated power connection for the package is not needed.

Additionally, it may be desired to pass signals through the switch circuit that have a greater amplitude than the voltage provided through the control connection. Passing such a signal through a switch circuit normally would result in the signal being clipped at or slightly below a supply voltage.

Figure 3:
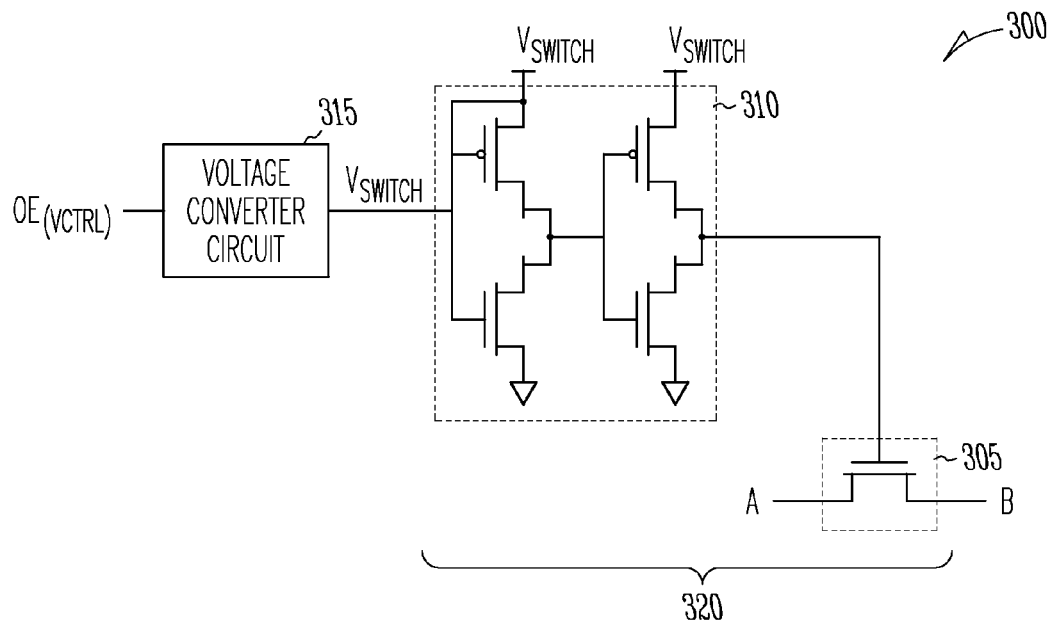
FIG. 3 is a schematic diagram of an example of an electronic circuit.

FIG. 3 is a schematic diagram of an example of an electronic circuit 300. The circuit 300 includes a voltage converter circuit 315. The voltage converter circuit 315 provides a voltage at its output ($V_{switch}$) that is greater than a voltage present at its input ($V_{ctrl}$). The input to the voltage converter circuit 315 is coupled to the control connection or output enable connection (OE).

The circuit 300 also includes a switch circuit 320 coupled to the signal input connection (A) and the signal output connection (B). The switch circuit 320 is also connected to the output of the voltage converter circuit. The switch circuit 320 passes a signal received at the input to the output when the switch circuit is activated by the voltage converter output. Note that power to the voltage converter circuit 315 is exclusively provided via the control connection, and the power to the switch circuit 320 is exclusively provided via the output of the voltage converter circuit 315.

The switch circuit 320 includes a pass gate 305 coupled to the signal input connection and the signal output connection. In some examples, the pass gate includes a transistor. In some examples, the pass gate 305 includes a CMOS transistor pair. Bulk connections for such transistors are provided by the output of the voltage converter circuit and the ground connection. Using a transistor pair may improve the dynamic range of the analog signal passed by the switch circuit 320.

The pass gate 305 is activated when an activating control signal is received at the control connection and is provided to the pass gate 305 by the voltage converter circuit 315. The activating signal provided by the voltage converter circuit 315 may have a higher voltage level than the signal received at the control connection. Power to the pass gate 305 is provided via the output of the voltage converter circuit 315. In some examples, the switch circuit is configured as a single pole single throw (SPST) switch. When an activation signal is present on the control connection (OE). The pass gate 305 is powered and the input (A) is available at the output (B). When the control connection is inactive, the pass gate 305 and the voltage converter circuit 315 are not supplied power and the input is not available at the output.

Because the voltage provided to the switch circuit ($V_{switch}$) can be greater than the voltage received at the control connection, the switch circuit 320 can pass signals having a greater amplitude than the control connection. In some examples, the voltage converter circuit 315 includes an up converter circuit or voltage boost circuit. In some examples, the voltage converter circuit 315 includes a charge pump circuit.

Figure 4:
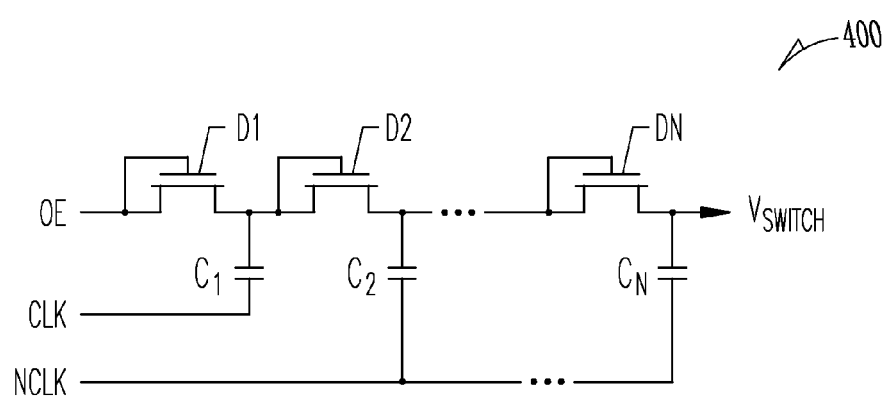
FIG. 4 is a schematic diagram of an example of a charge pump circuit.

FIG. 4 is a schematic diagram of an example of a charge pump circuit 400. The example shown is a capacitor-diode ladder circuit. The circuit is powered by the control connection (OE). Charge is alternately stored and transferred on the capacitors to form the output voltage. The charging and transfer cycles are controlled by the clock signals CLK and NCLK. When CLK is low, capacitor C1 is charged to the voltage of the control connection (e.g., 1.8V or 1.2V in low voltage applications) minus a voltage drop of the diode.

Clock signal NCLK is out of phase with CLK and the active portion of the signal (e.g. NCLK=high) does not overlap with the active portion of CLK. When CLK is high and NCLK is low, capacitor C2 charges to the voltage on C1 ($V_{C1}$) plus the voltage of CLK. Note that "high" voltages of a logic signal are usually the voltage of the supply. If the circuit generating the clocks is also powered by the control connection, then the high voltages of CLK and NCLK will be approximately the voltage of the control connection ($V_{ctrl}$). In this case the voltage on capacitor C2 is ($V_{C1}+V_{CLK}$) or about twice $V_{ctrl}$. The third stage would charge to ($V_{C2}+V_{CLK}$) or three times $V_{ctrl}$, and so on.

In certain examples, the charge pump circuit 400 may include an output capacitor to smooth the voltage at the output. In certain examples, a band gap voltage circuit may be included in the circuit 400 to control activation of the charge pump circuit 400. The band gap voltage circuit provides a voltage reference. The clock signals are activated when the output drops below the band gap reference.

Figure 5:
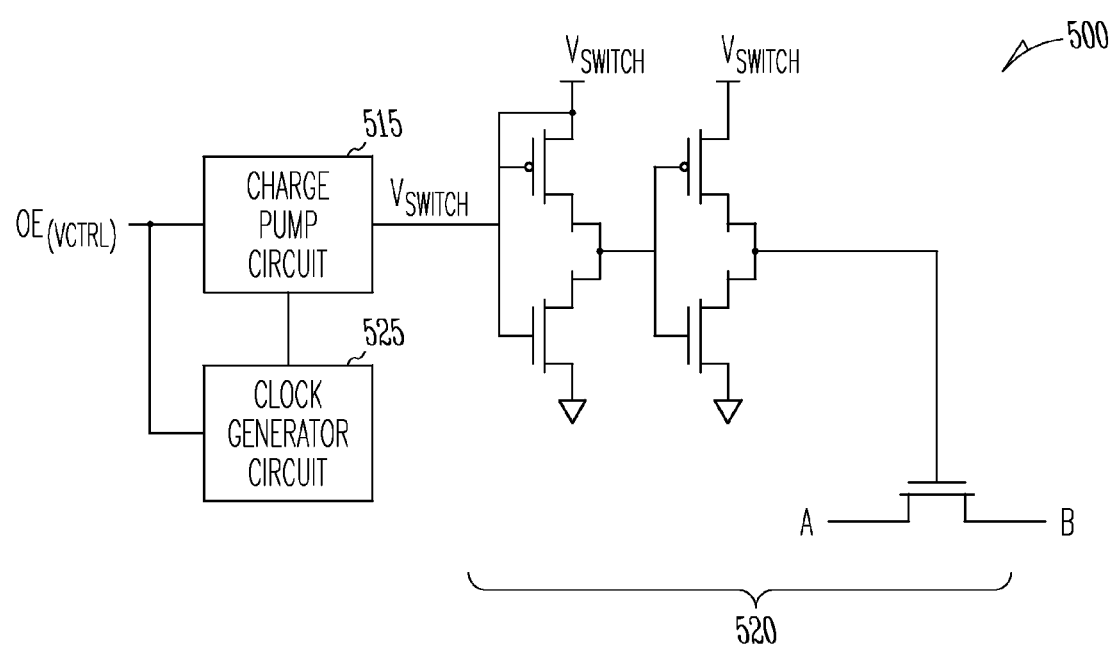
FIG. 5 is a schematic diagram of another example of an electronic circuit.

FIG. 5 is a schematic diagram of another example of an electronic circuit 500. In the example, the voltage converter circuit is a charge pump circuit 515. The circuit 500 includes a clock generator circuit 525. The clock generator circuit 525 is coupled to the control connection and the charge pump circuit 515. The charge pump circuit 515 is configured to receive a clock signal from the clock generator circuit 525. Power to the clock generator circuit 525 is provided by the control connection. Because the clock signals are not greater than $V_{ctrl}$, bulk connections for transistors used in the circuit generating the clocks can be provided by the circuit ground connection and the control connection.

In some examples, the charge pump circuit 515 provides a voltage to the switch circuit 520 that is about twice the voltage received at the control connection. This allows the switch circuit 520 to pass an analog signal having about twice the amplitude of the control connection voltage without clipping. In some examples, the charge pump circuit 515 provides a voltage to the switch circuit 520 that is about three time the voltage received at the control connection. This allows the switch circuit 520 to pass an analog signal having about three times the amplitude of the control connection voltage without clipping.

Returning to FIG. 3, in some examples the circuit 300 includes a buffer circuit 310 connected between the control connection and the pass gate 305. Power to the buffer circuit 310 is provided via the output of the voltage converter circuit 315. In certain examples, the buffer circuit 310 provides hysteresis to the control connection. For instance, the buffer circuit 310 may provide a first voltage level to activate the voltage converter circuit and a second voltage level to deactivate the voltage converter circuit. Hysteresis may be provided by having the first voltage level higher than the second voltage level. Having hysteresis at the control connection may alleviate noise at the control connection being evident at the output connection.

In certain examples, a buffer circuit (not shown) is connected between the input connection and the pass gate. The buffer circuit is configured to delay a signal received at the input connection relative to the control signal received at the control connection. A time delay may be necessary to allow the charge pump circuit 515 and the switch circuit 520 to properly power up before arrival of an input signal. The delay may be longer than a time for the voltage converter circuit 515 to produce a voltage at its output that is greater than the control connection voltage. A time delay that is built-in to the switch circuit may mean that a electronic system designer does not have to be concerned with the timing of arrival of the input and the control signal.

Figure 6:
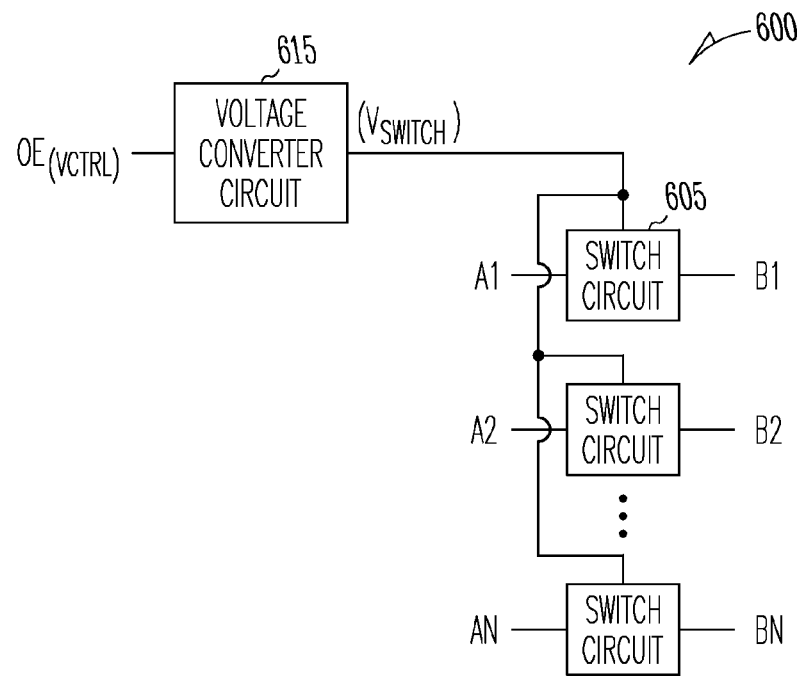
FIG. 6 is a schematic diagram of an example of a circuit that includes multiple switches.

FIG. 6 is a schematic diagram of an example of an electronic circuit 600 that includes multiple switches. The circuit 600 includes a plurality of input connection and output connection pairs. A switch circuit 605 (e.g., a pass gate) is connected between an input connection and output connection pair. The circuit 600 may have 1 to N switches where N is a positive integer. Each switch circuit of the N switch circuits passes a signal received at its input connection to its output connection when the switch circuit is activated. Activation of the switches occurs when a control signal is received at the control connection. The control signal powers the voltage converter circuit 615. The control signal is provided to the switch circuits by the voltage converter circuit 615. In some examples, the control signal provided by the voltage converter-circuit 615 ($V_{switch}$) has a voltage greater than the control signal received at the control connection ($V_{ctrl}$). The circuit 600 may include a buffer circuit between the output of the voltage converter circuit 615 and the switches to provide enough drive to overcome the capacitive load of the N switches. Power to the switch circuits and any buffer circuits is provided by the voltage converter circuit 615 and not by a separate dedicated power connection.

Figure 7:
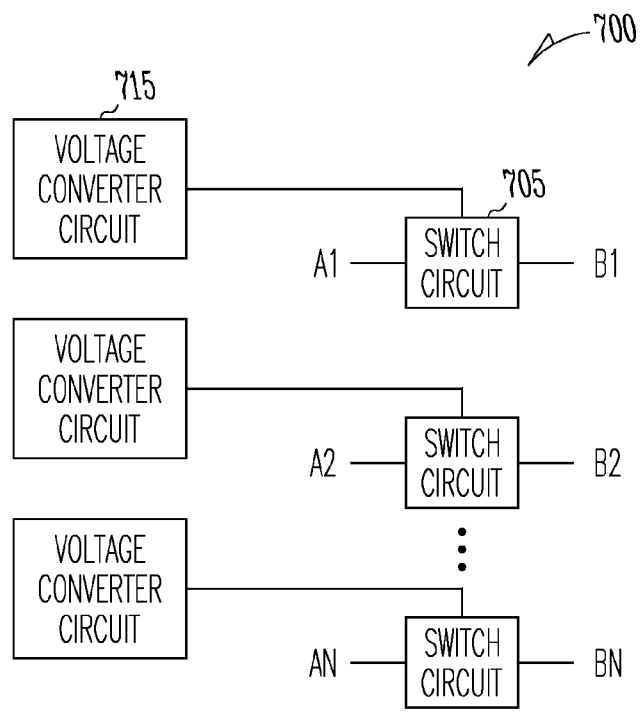
FIG. 7 is a schematic diagram of another example of a circuit that includes multiple switches.

FIG. 7 is a schematic diagram of another example of a circuit 700 that includes multiple switches. In contrast to FIG. 7, the circuit 700 includes a control connection and a voltage converter circuit 715 for each switch circuit 705. Each switch circuit 705 passes a signal received at its input connection to its output connection when the switch circuit is activated by a control signal received at its control connection and provided to the switch circuit 705 by its corresponding voltage converter circuit 715. Power to each switch circuit 705 is provided via the output of its corresponding voltage converter circuit 715 and not by a separate dedicated power connection.

Figure 8:
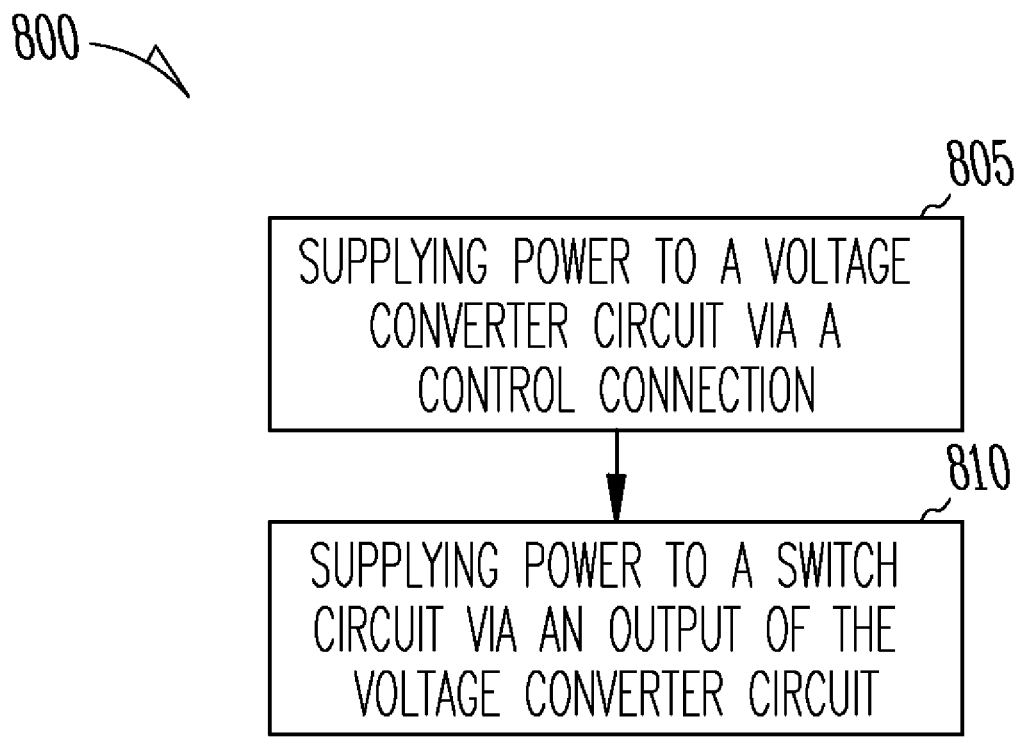
FIG. 8 is a flow diagram of a method of implementing a switch circuit.

FIG. 8 is a flow diagram of a method 800 of implementing a switch circuit. At block 805 power is supplied to a voltage converter circuit via a control connection. The voltage converter circuit is configured to provide an output voltage that is greater than an input voltage to the voltage converter circuit. A non-exhaustive list of examples of a voltage converter circuit include an up converter circuit, a voltage boost circuit, or a charge pump circuit.

At block 810, power is supplied to a switch circuit via an output of the voltage converter circuit. The switch circuit passes a signal received at an input of the switch circuit to an output of the switch circuit when the switch circuit is activated by the output of the voltage converter circuit. Power is supplied to the voltage converter circuit and the switch circuit without a separate dedicated power connection.

In some examples, the method 800 includes packaging the voltage converter circuit and the switch circuit in a four connector package. The four connectors may be an input connection, an output connection, a control connection, and a circuit ground connection. The four connector package allows an analog switch to be provided in a small package that can pass a signal with a voltage amplitude greater than a voltage used to provide power to the analog package.

Additional Notes

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An integrated circuit comprising:
   at least one input connection;
   at least one output connection;
   at least one control connection;
   a voltage converter circuit having an input and an output, wherein the input is coupled to the control connection, wherein power to the voltage converter circuit is provided via the control connection by a control signal, and wherein the voltage converter circuit is configured to provide a voltage at the output that is greater than a voltage present at the input; and
   at least one switch circuit configured to pass a signal received at the input connection to the output connection when the switch circuit is both activated and powered by the voltage converter output when the control signal is applied to the control connection.

2. The integrated circuit of claim 1, wherein there is not a separate dedicated power connection to provide power to the switch circuit or the voltage converter circuit.

3. The integrated circuit of claim 1, wherein the voltage converter circuit includes a charge pump circuit.

4. The integrated circuit of claim 3, including a clock generator circuit coupled to the control connection and the charge pump circuit, wherein the charge pump circuit is configured to receive a clock signal from the clock generator circuit, and wherein power to the clock generator circuit is provided by the control connection.

5. The integrated circuit of claim 3, wherein the charge pump circuit provides a voltage to the switch circuit that is about twice a voltage received at the control connection.

6. The integrated circuit of claim 1, wherein the switch circuit includes a pass gate, wherein the pass gate is activated when a control signal is received at the control connection and provided to the pass gate by the voltage converter circuit, and wherein power to the pass gate is provided via the output of the voltage converter circuit.

7. The integrated circuit of claim 6, wherein an input signal at the input connection is available at the output connection when the pass gate is activated, and wherein the signal at the output connection has a greater voltage than a voltage of the control connection.

8. The integrated circuit of claim 6, including a buffer circuit connected between the control connection and the pass gate, wherein power to the buffer circuit is provided via the output of the voltage converter circuit.

9. The integrated circuit of claim 8, wherein the buffer circuit provides a first voltage level to activate the voltage converter circuit and a second voltage level to deactivate the voltage converter circuit, wherein the first voltage level is greater than the second voltage level.

10. The integrated circuit of claim 6, including a buffer circuit connected between the input connection and the pass gate, wherein the buffer circuit is configured to delay a signal received at the input connection relative to the control signal received at the control connection, wherein the delay is longer than a time for the voltage converter circuit to produce the voltage at its output that is greater than the voltage at its input.

11. The integrated circuit of claim 1, wherein the integrated circuit is included in a four-connector package, and wherein the connectors of the four connector package consist of:
   the input connection;
   the output connection;
   the control connection; and
   a circuit ground connection.

12. The integrated circuit of claim 1, including
   a plurality of input connection and output connection pairs; and
   a switch circuit connected between each input connection and output connection pair, wherein each switch circuit passes a signal received at its input connection to its output connection when a control signal is received at the control connection and provided to the switch circuit by the voltage converter circuit, and wherein power to the switch circuits is provided via the output of the voltage converter circuit.

13. The switch circuit of claim 1, wherein the switch circuit is configured as a single pole single throw (SPST) switch.

14. The integrated circuit of claim 1, including:
   a plurality of input connection and output connection pairs;
   a switch circuit connected between each input connection and output connection pair;
   a control connection for each switch circuit; and
   a voltage converter circuit for each switch circuit coupled between the control connection and the switch circuit,
   wherein each switch circuit passes a signal received at its input connection to its output connection when a control signal is received at the control connection and provided to the switch circuit by its corresponding voltage converter circuit, and wherein circuit power to each switch circuit is provided via the output of its corresponding voltage converter circuit.

15. A method comprising:
   supplying power to a voltage converter circuit via a control connection by a control signal, wherein the voltage converter circuit is configured to provide an output voltage that is greater than an input voltage to the voltage converter circuit; and passing a signal received at an input of a switch circuit to an output of the switch circuit when the switch circuit is both activated and powered by the output of the voltage converter circuit when the control signal is applied to the control connection.

16. The method of claim 15, including supplying power to the voltage converter circuit and the switch circuit without a separate dedicated power connection.

17. The method of claim 15, wherein supplying power to a voltage converter circuit via a control connection includes supplying power to a charge pump circuit, wherein power to the charge pump circuit is provided by the control connection and power to the switch circuit is provided by the charge pump circuit.

18. The method of claim 15, including packaging the voltage converter circuit and the switch circuit in a four connector package.

19. The method of claim 18, wherein connectors of the four connector package consist of:
an input connection;
an output connection;
a control connection; and
a circuit ground connection.

20. The method of claim 15, including providing hysteresis at the control connection to provide an activating trip voltage level for the voltage converter circuit that is greater than a deactivating trip voltage level for the voltage converter circuit.

* * * * *